(12) United States Patent  (10) Patent No.: US 7,656,657 B2
Grady et al.  (45) Date of Patent: Feb. 2, 2010

(54) SYSTEM AND METHOD FOR TOOL-LESS MOUNTING OF A DEVICE WITH A CHASSIS

(75) Inventors: John R. Grady, Cypress, TX (US); John P. Franz, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 404 days.

(21) Appl. No.: 11/656,070

(22) Filed: Jan. 22, 2007

(65) Prior Publication Data

US 2007/0279886 A1  Dec. 6, 2007

Related U.S. Application Data

(60) Provisional application No. 60/809,322, filed on May 30, 2006.

(51) Int. Cl.
*H05K 5/00* (2006.01)
*H05K 7/00* (2006.01)

(52) U.S. Cl. .................... 361/679.37; 361/679.38; 361/679.39

(58) Field of Classification Search ............ 361/679.37, 361/679.38, 679.39, 727
See application file for complete search history.

(56) References Cited

U.S. PATENT DOCUMENTS

| | | | |
|---|---|---|---|
| 5,369,645 A | 11/1994 | Pritchard et al. | |
| 5,764,254 A | 6/1998 | Nicoloff et al. | |
| 5,818,689 A * | 10/1998 | Johns et al. ............ | 361/679.57 |
| 5,971,524 A | 10/1999 | Nicoloff et al. | |
| D473,562 S | 4/2003 | Russell | |
| D473,563 S | 4/2003 | Russell et al. | |
| 6,666,340 B2 | 12/2003 | Basinger et al. | |
| 6,669,497 B2 | 12/2003 | Westphall et al. | |
| 6,724,628 B2 | 4/2004 | Franz et al. | |
| 6,754,084 B1 | 6/2004 | Bolognia et al. | |
| 6,762,932 B2 * | 7/2004 | Regimbal et al. ...... | 361/679.33 |
| 6,829,146 B2 | 12/2004 | Franz et al. | |
| 6,858,792 B2 | 2/2005 | Franz et al. | |
| 6,954,940 B2 * | 10/2005 | Hsu .......................... | 720/639 |
| 6,987,672 B2 | 1/2006 | Franz et al. | |
| 7,026,551 B2 | 4/2006 | Franz et al. | |
| 7,027,309 B2 | 4/2006 | Franz et al. | |
| 7,035,096 B2 | 4/2006 | Franz et al. | |
| 7,492,584 B2 * | 2/2009 | Fan et al. ................. | 312/223.2 |
| 2001/0026437 A1 * | 10/2001 | Naruo et al. ................ | 361/685 |
| 2004/0174681 A1 | 9/2004 | Franz et al. | |
| 2005/0078452 A1 | 4/2005 | Franz et al. | |

* cited by examiner

*Primary Examiner*—Jayprakash N Gandhi
*Assistant Examiner*—Anthony M Haughton

(57) ABSTRACT

Embodiments of the present invention are directed to a mounting system. The mounting system may include a chassis comprising a base and a plurality of guide ramps and a plurality of mounting spools arranged in pairs extending from a first side of the base, wherein the pairs are unaligned with respect to one another relative to a direction along at least one length of the base. Further, the mounting system may include a backing plate coupled to the chassis via engagement of the pairs with a plurality of receptacles in the backing plate.

19 Claims, 9 Drawing Sheets

SYSTEM AND METHOD FOR TOOL-LESS MOUNTING OF A DEVICE WITH A CHASSIS

This application claims the benefit of U.S. Provisional Application No. 60/809,322, filed May 30, 2006.

BACKGROUND

This section is intended to introduce the reader to various aspects of art, which may be related to various aspects of the present invention that are described or claimed below. This discussion is believed to be helpful in providing the reader with background information to facilitate a better understanding of the various aspects of the present invention. Accordingly, it should be understood that these statements are to be read in this light, and not as admissions of prior art.

A typical blade server system may include a blade enclosure that houses a number of individual minimally-packaged computer motherboards. These computer motherboards may be referred to as blade servers or simply "blades." Each blade in a typical blade server system is generally arranged within a blade enclosure of the system and typically includes one or more processors, memories, network connections, and so forth. Blade servers may generally be described as self-contained computer servers designed for high density arrangement within a blade enclosure. For example, densities of more than one-hundred computers per blade enclosure may be achieved with blade server systems. Because of the compact nature of blade servers, it may be desirable to simplify and improve accessibility to server components.

DETAILED DESCRIPTION OF SPECIFIC EMBODIMENTS

One or more exemplary embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
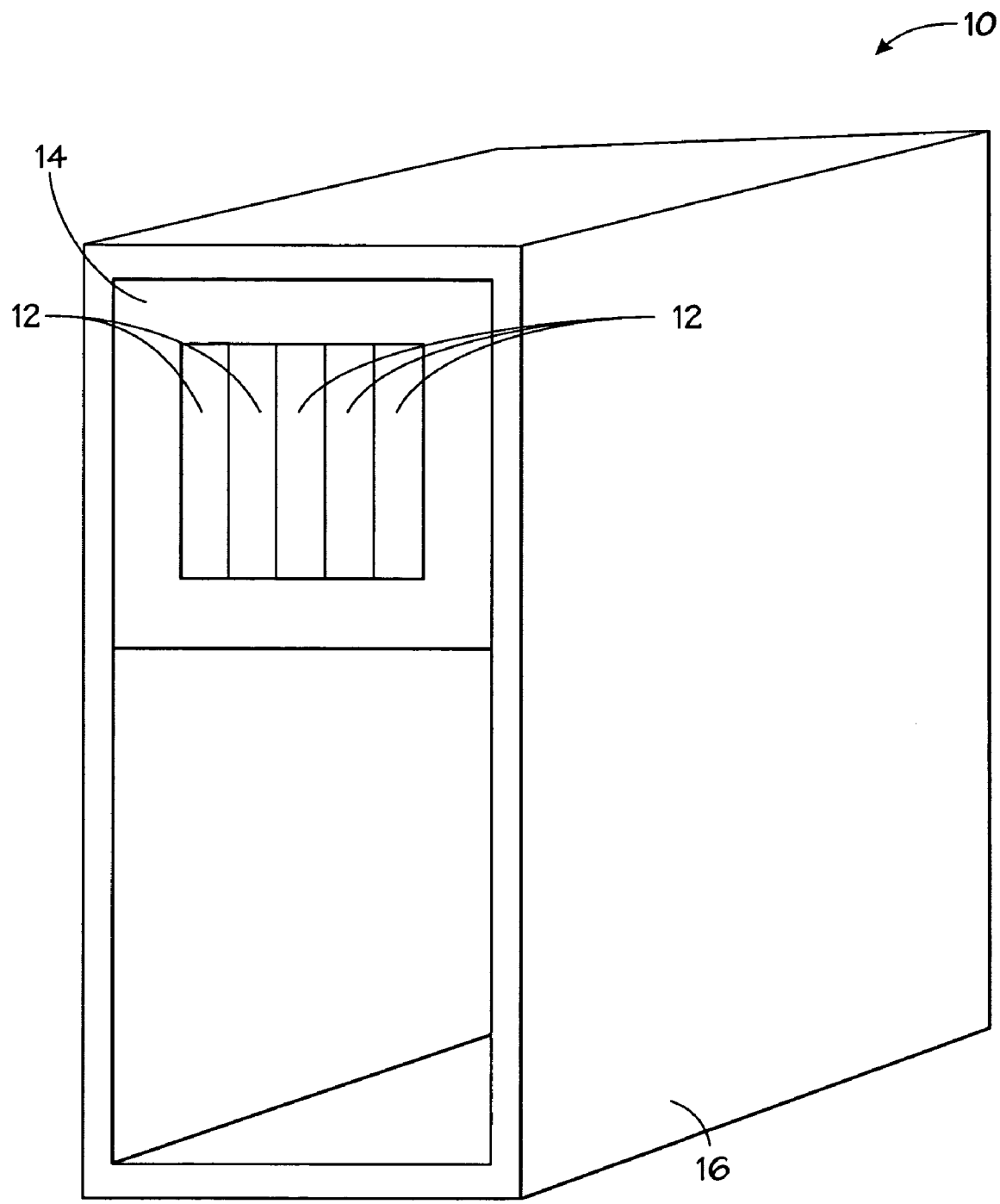
FIG. 1 is a perspective view of a blade server rack system in accordance with an exemplary embodiment of the present invention.

FIG. 1 is a perspective view of a blade server rack system 10 in accordance with an exemplary embodiment of the present invention. The blade server rack system 10 includes a plurality of blade servers 12 disposed within a blade enclosure 14 (e.g., a system chassis), which is mounted within a rack structure 16. Embodiments of the present invention are directed to an apparatus configured for mounting a system board in a server chassis to form one of the blade servers 12. It should be noted that the illustrated embodiment is exemplary. In other embodiments, electronic features other than system boards may be mounted to a chassis to form specific electronic devices other than a server (e.g., a memory system, a control system or a personal computer). For example, present embodiments may include mounting any electronic computer board (e.g., an input/output board or a memory board) or other electronic devices (e.g., a disk drive, a hard drive, or a power supply) to a chassis to form a specific electronic device.

Specifically, embodiments of the present invention may facilitate rapid insertion and extraction of the system board from the server chassis without the use of tools and without the hassles associated with the use of traditional mounting hardware (e.g., machine screws used to couple the system board directly to the chassis). For example, in accordance with present embodiments, the frustration of loosing machine screws or dropping them in the server 12 during installation may be avoided. The server mounting system may include a backing plate configured to couple with a system board (e.g., mother board) and slide into a coupled configuration with the server chassis. The backing plate may include bottle-shaped holes (e.g., holes that are tapered on one end) that are arranged in a staggered pattern to pass over and automatically align with retention features extending from the server chassis. The backing plate may operate as a protective covering that resists impact and prevents damage from occurring to the system board during installation and extraction. Further, embodiments of the present invention may resist electromagnetic interference (EMI) without employing EMI clips and gaskets, which are often utilized in traditional server mounting systems.

Figure 2:
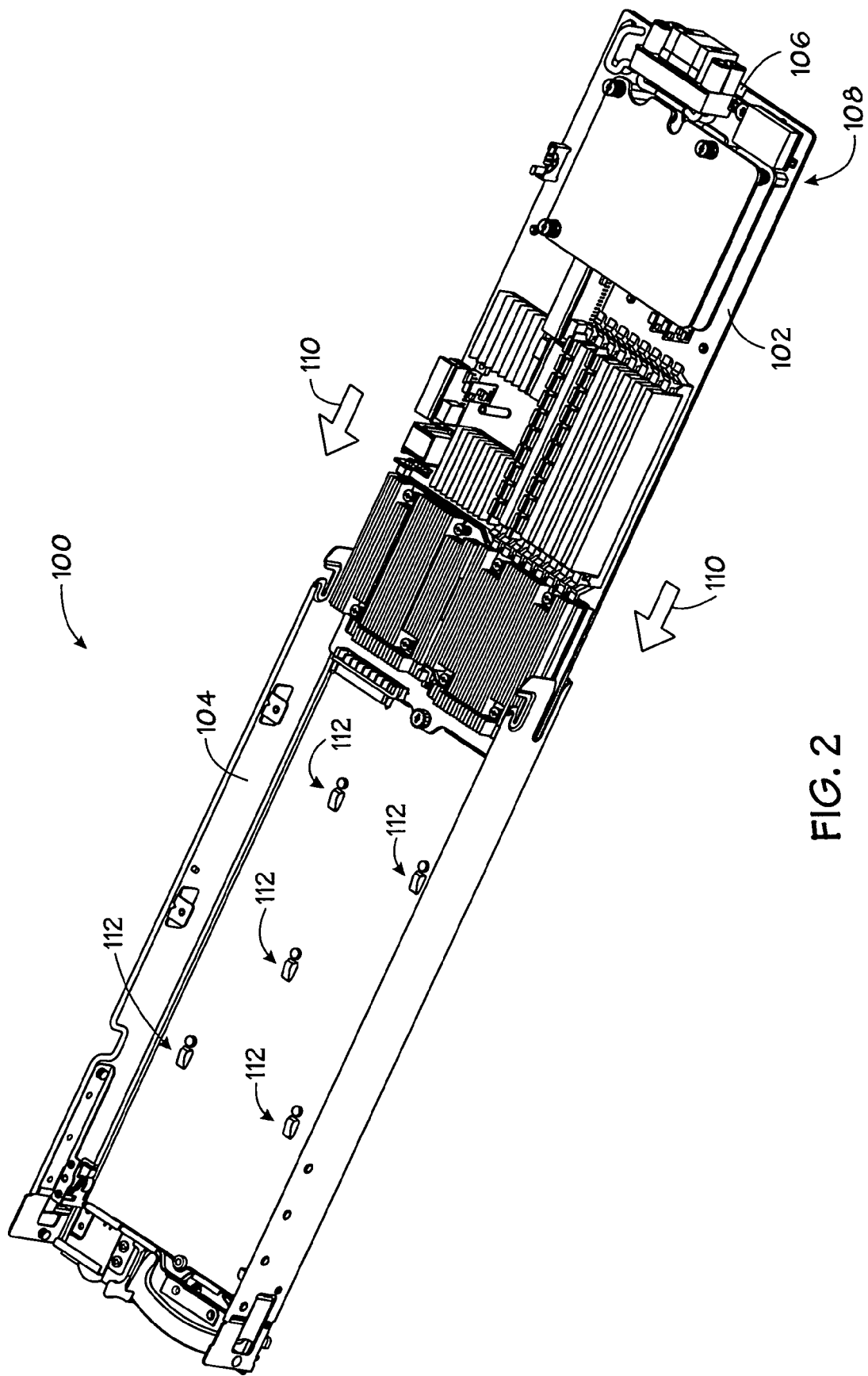
FIG. 2 is a perspective view of a blade server being assembled in accordance with an exemplary embodiment of the present invention.

FIG. 2 is a perspective view of a blade server 100 being assembled in accordance with an exemplary embodiment of the present invention. The blade server 100 has at least three major components, which include a blade system board 102, a blade server chassis 104, and a backing plate 106. The backing plate 106 is only partially visible in the illustrated embodiment because it is coupled to an underside of the system board 102. The system board 102 may be representative of any electronic board (e.g., personal computer board) that may be coupled to the backing plate 106. In a coupled configuration, the backing plate 106 and the system board 102 may be referred to as a board assembly 108. Additionally, the backing plate 106 and the system board 102 are illustrated in the process of being slideably coupled (e.g., slid together into a coupled configuration) with the chassis 104 in FIG. 2, as indicated by arrows 110. In other words, the board assembly 108 slides along the chassis 104 into a coupled configuration with the chassis 104. Specifically, holes in the backing plate 106 can slide over ramp and spool pairs 112 extending from the chassis 104 to establish a cooperative coupling between the board assembly 108 and the chassis 104, as will be discussed in further detail below. Once assembled, the blade server 100 can be installed into one of a plurality of blade receptacles in the blade enclosure 14, which in certain embodiments is then mounted in the rack structure 16.

Figure 3:
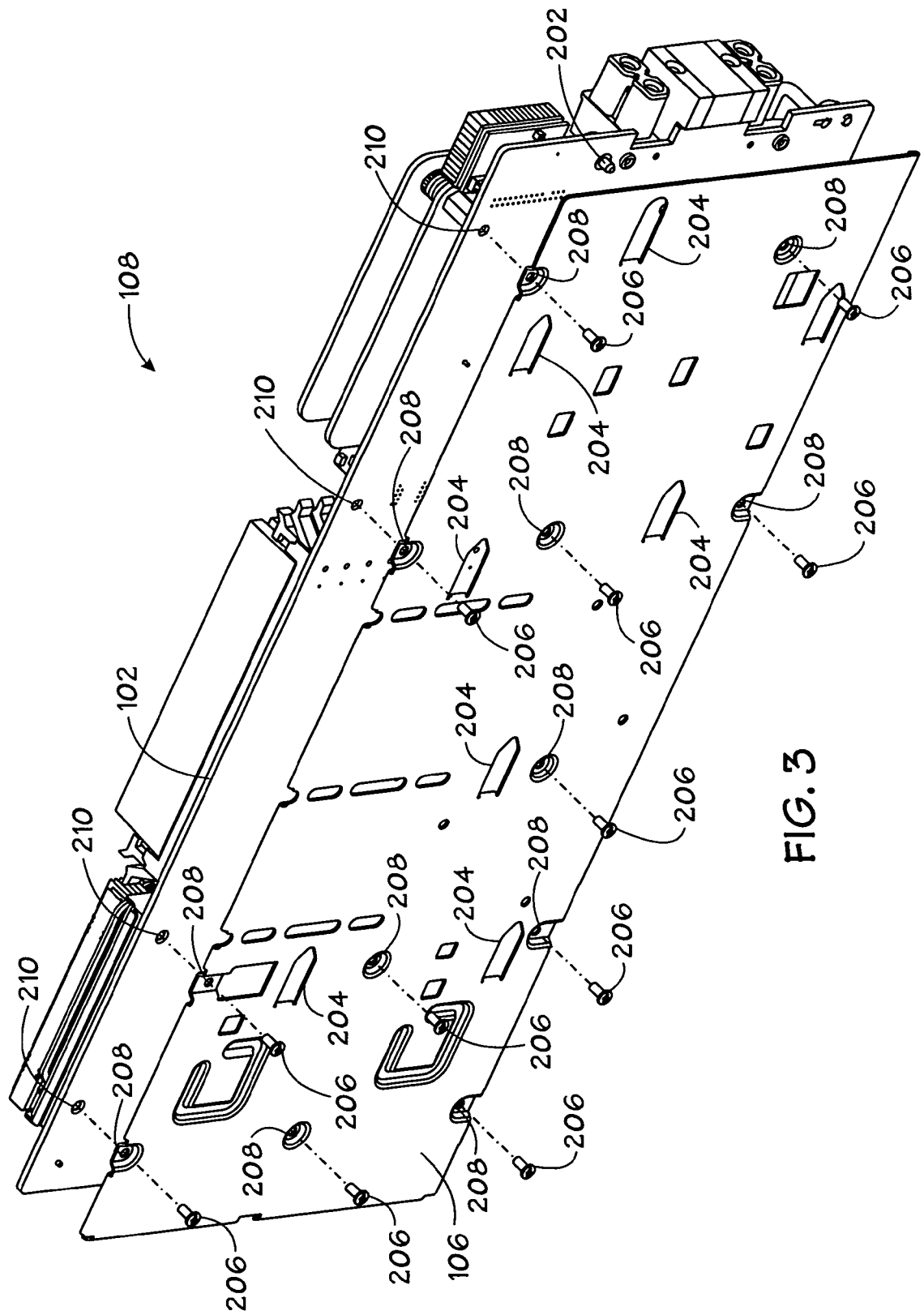
FIG. 3 is an exploded perspective view of a board assembly in accordance with an exemplary embodiment of the present invention.

FIG. 3 is an exploded perspective view of the board assembly 108 in accordance with an exemplary embodiment of the present invention. As set forth above, the board assembly 108 includes the blade system board 102 and the backing plate 106 in a coupled configuration. The blade system board 102 may include a motherboard that functions as the central component of the blade server 100 and fasteners 202 (e.g., thumb screws, spring catches, flexible latches, and pins) to facilitate coupling of the board assembly 108 to the chassis 104. In some embodiments, the fasteners 202, such as spring catches, may automatically provide retention when the board assembly 108 is slid into the chassis 104 and allow quick release by user actuation. The backing plate 106 may include a piece of sheet metal with a plurality of mounting receptacles 204 (e.g., tapered or bottle-shaped holes) with edges configured to engage the ramp and spool pairs 112 extending from the chassis 104. In the illustrated embodiment, the backing plate 106 is coupled to the blade system board 102 via a plurality of fasteners 206. Specifically, in the illustrated embodiment, the system board 102 and the backing plate 106 are coupled together with machine screws 206 that pass through attachment locations 208 in the backing plate 106 and into receptacles 210 in the system board 102. In the illustrated embodiment, the attachment locations 208 are recessed into the backing plate 106 so that the heads of the machine screws can be retained without extending beyond the bottom surface of the backing plate 106. This recess enables the board assembly 108 to rest flush on the backing plate 106 when mounted in the server chassis 104 instead of resting on the machine screw heads.

Figure 4:
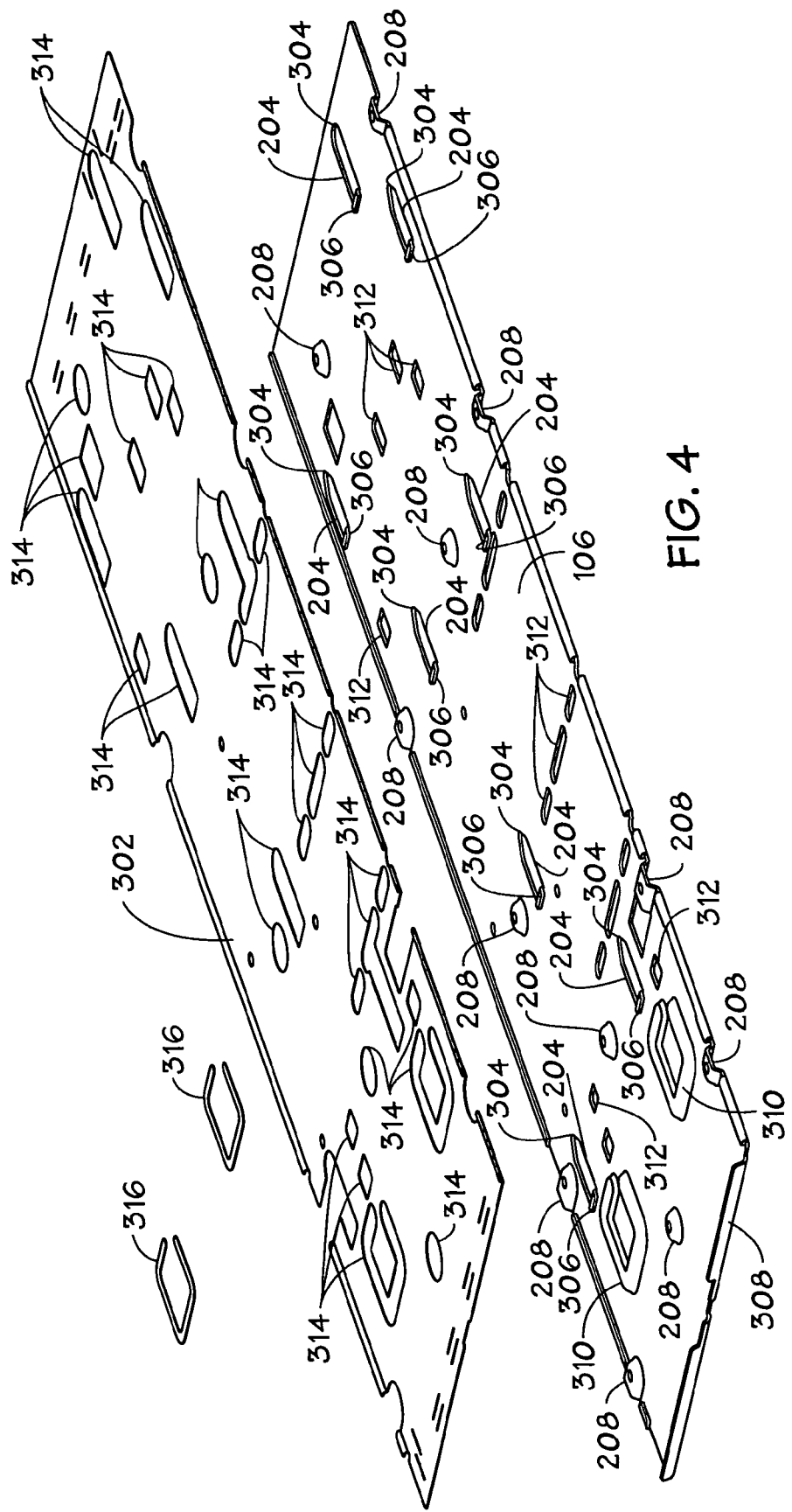
FIG. 4 is an exploded perspective view of a backing plate and a protective layer in accordance with an exemplary embodiment of the present invention.

FIG. 4 is an exploded perspective view of the backing plate 106 and a protective layer 302 (e.g., a polyester film) in accordance with an exemplary embodiment of the present invention. The backing plate 106 and the protective layer 302 may be coupled together via an adhesive or fasteners. Additionally, the protective layer 302 may simply be wedged between the backing plate 106 and the system board 102 in a coupled configuration of the backing plate 106 and the system board 102. The backing plate 106 and/or the protective layer 302 may serve various purposes. For example, the backing plate 106 includes the mounting receptacles 202 that facilitate coupling the board assembly 108 to the chassis 104. Additionally, the backing plate 106 and the protective layer 302 may serve to protect the bottom side components of the system board 102 during installation, operation, and removal of the board assembly 108. Further, the backing plate 106 may contact the system board 102 such that it provides resistance to EMI.

The backing plate 106 includes various mounting features that facilitate coupling of the backing plate 106 to the chassis 104 in accordance with present embodiments. For example, the mounting receptacles 204 are configured to pass over and engage the corresponding ramp and spool pairs 112 of the chassis 104 without a user blindly attempting to locate standoffs. Indeed, each of the mounting receptacles 204 is arranged to correspond with the position of one of the ramp and spool pairs 112. However, while the mounting receptacles 204 are configured to align with the ramp and spool pairs 112, the mounting receptacles 204 are unaligned with respect to one another in at least one direction. Accordingly, the ramp and spool pairs 112 are correspondingly unaligned with respect to one another to facilitate coupling. Specifically, the mounting receptacles 204 are unaligned with each other and the ramp and spool pairs 112 are unaligned with each other in the direction (e.g., arrow 110) that the board assembly 108 is inserted into the chassis 104. This unaligned positioning of the mounting features (i.e., the mounting receptacles 204 and the ramp and spool pairs 112) avoids installation difficulties. For example, if these mounting features were aligned with respect to the insertion direction 110, the mounting receptacles 204 could prematurely engage with the ramp and spool pairs 112. In a specific example, if two or more ramp and spool pairs 112 were in a line, the corresponding mounting receptacles 204 would also be in a line, and the first receptacle to pass over the first ramp and spool pair 112 may engage with the first ramp and spool pair 112. This would prevent further insertion of the board assembly 108 into the chassis 104 and, thus, prevent the board assembly 108 from completely engaging the chassis 104.

In the illustrated embodiments of FIG. 4, the mounting receptacles 204 each have a generally elongate shape with a tapered end 304. In other words, the mounting receptacles 204 are essentially bottle-shaped or bullet-shaped in the illustrated embodiment. In other embodiments, the mounting receptacles 204 may include different shapes (e.g., rectangular, tapered, triangular, or oval). Additionally, the mounting receptacles 204 each include a rolled edge 306 to facilitate smooth installation and removal of the board assembly 108 from the chassis 104. In some embodiments, the rolled edge 306 may include an edge that is smoothed, rounded, or folded back (e.g., a Dutch hem). In the illustrated embodiment, the rolled edge 306 includes a folded or curved portion of the sheet metal to form a gradual curvature or ramp into the mounting receptacles 204. The curved edge 306 on each mounting receptacle 204 is located on the side of the mounting receptacle 204 opposite the tapered edges 304. These rolled edges 306 may facilitate smooth passage of the mounting receptacles 204 over the ramp and spool pairs 112 without having the receptacles 204 hang on the ramp and spool pairs 112 or other chassis features, which more angled edges may be prone to doing. Additionally, the backing plate 106 includes a lead-in ramp 308 that facilitates smooth installation of the board assembly 108 into the server chassis 104. The lead-in ramp 308 may facilitate sliding the backing plate 106 over chassis features without hanging on them because the lead-in ramp 308 is angled to guide the backing plate 106 over such features. For example, the lead-in ramp 308 may be oriented at an acute angle (e.g., 20, 30, 40, 50, or 60 degrees) relative to the generally planar sheet metal of the backing plate 106.

The backing plate 106 also includes various structural features in accordance with present embodiments. For example, the backing plate 106 includes board supports 310 and clearance openings 312. The board supports 310 may be included to resist warping of the backing plate 106 and/or system board 102. For example, forces associated with coupling certain components (e.g., heat sinks) to the system board 102 can cause bending of the system board 102 and/or bending of the backing plate 106. Accordingly, the board supports 310 may be arranged proximate the location for coupling such components to increase stability and rigidity in those areas. The clearance openings 312 may be included in the backing plate 106 to receive bottom side components of the system board 102 and to limit the height of the server 100. For example, certain components on the bottom side of the system board 102 may have different heights and may normally prevent the backing plate 106 from being positioned a substantially consistent fixed distance from the blade system board 102. Accordingly, such components may be received into the clearance openings 312 to facilitate a uniform fit between the system board 102 and the backing plate 106 and to limit the height of the combined board assembly 108.

The protective layer 302 (e.g., a Mylar sheet) may be configured to serve as a barrier between the sheet metal backing plate 106 and the bottom side components of the system board 102. The protective layer 302 may provide heat insulation, electrical insulation, EMI shielding, and protection from contact. For example, the protective layer 302 may include an insulating sheet (e.g., a Formex™ sheet or a polyester film) that couples (e.g., adhesively bonds) to the side of the backing plate 106 that is adjacent the system board 102 when the system board 102 and the backing plate 106 are in a coupled configuration. Thus, the protective layer 302 may resist or buffer potentially harmful contact between the system board 102 and the backing plate 106. The protective layer 302 may also be configured to receive or cooperate with certain features of the backing plate 106. For example, in the illustrated embodiment, the protective layer 302 includes a number of openings 314 and cut-outs 316 that correspond to features of the backing plate 106. Some of the openings 314 align with the mounting receptacles 204 on the backing plate 106 to facilitate reception of the ramp and spool pairs 112 through the backing plate 106 and the protective layer 302. Other openings 314 may align with the clearance openings 312 to receive components from the back side of the system board 102. The cut-outs 316 align with the support features 310 on the backing plate 106 to provide a buffer between the support features 310 and the system board 102.

Figure 5:
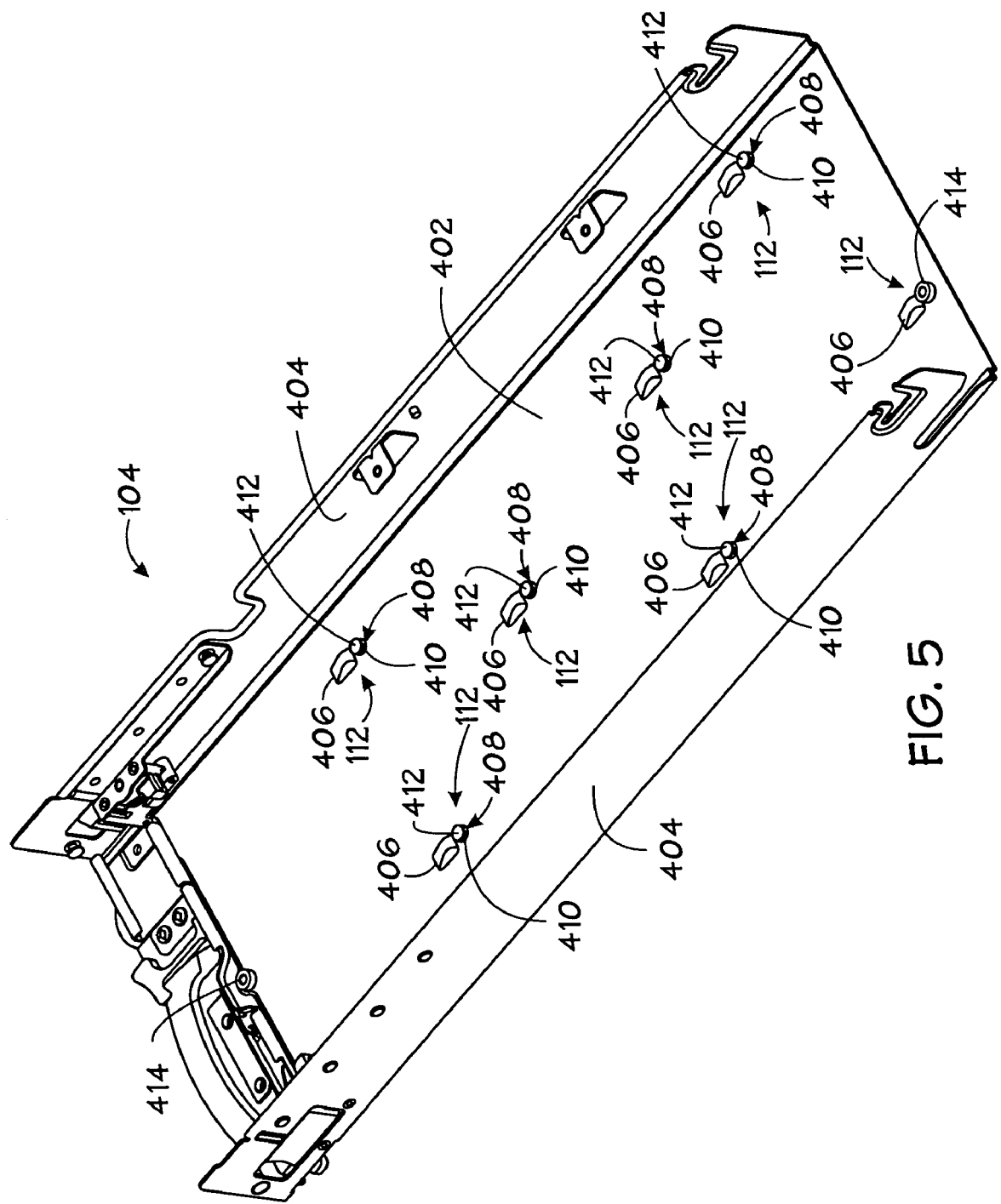
FIG. 5 is a perspective view of a blade server chassis in accordance with an exemplary embodiment of the present invention.
Figure 6A:
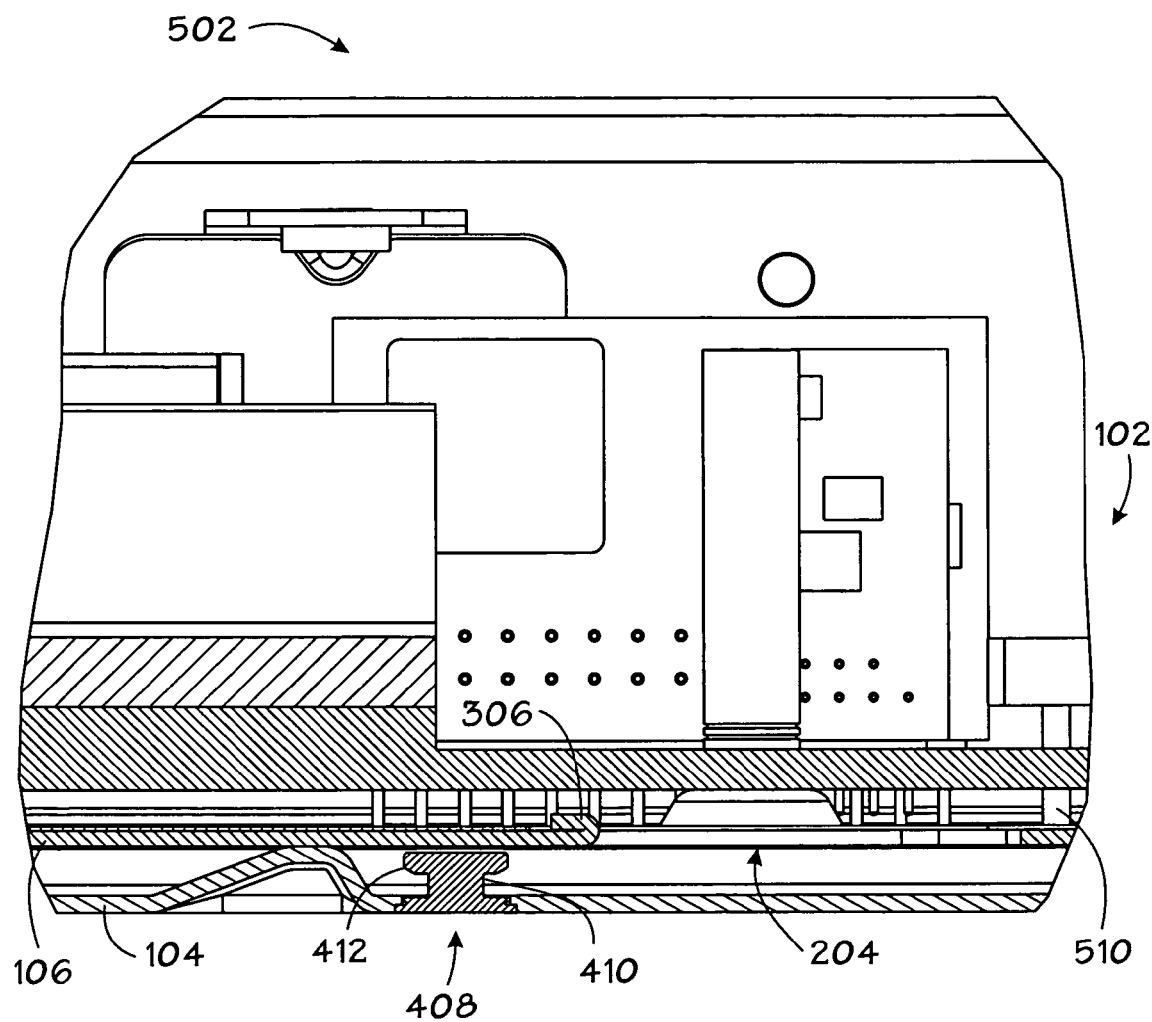
FIGS. 6A, 6B, 6C, and 6D are a series of four cross-sectional views of a board assembly being slideably mounted to a chassis in accordance with an exemplary embodiment of the present invention.
Figure 6B:
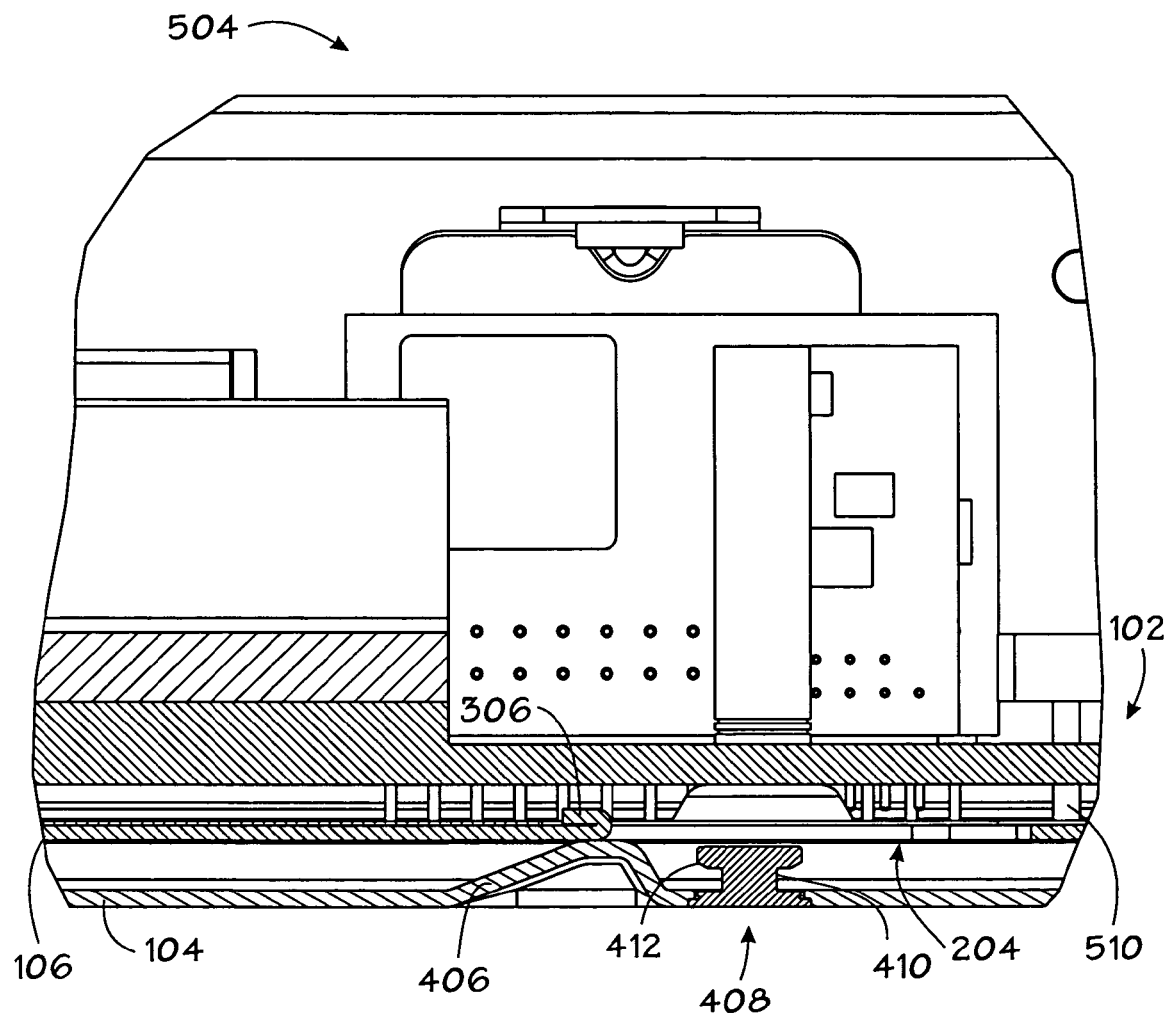
Figure 6C:
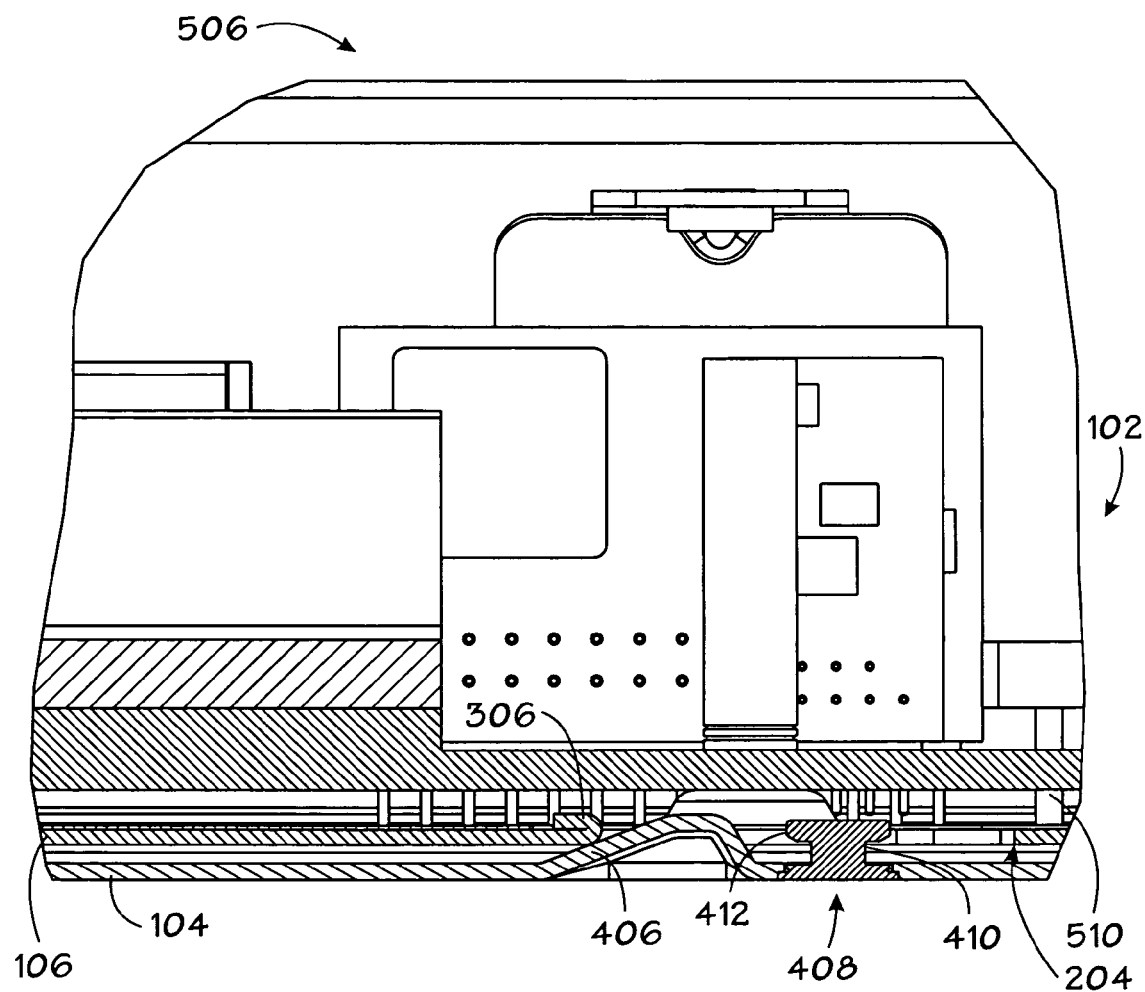
Figure 6D:
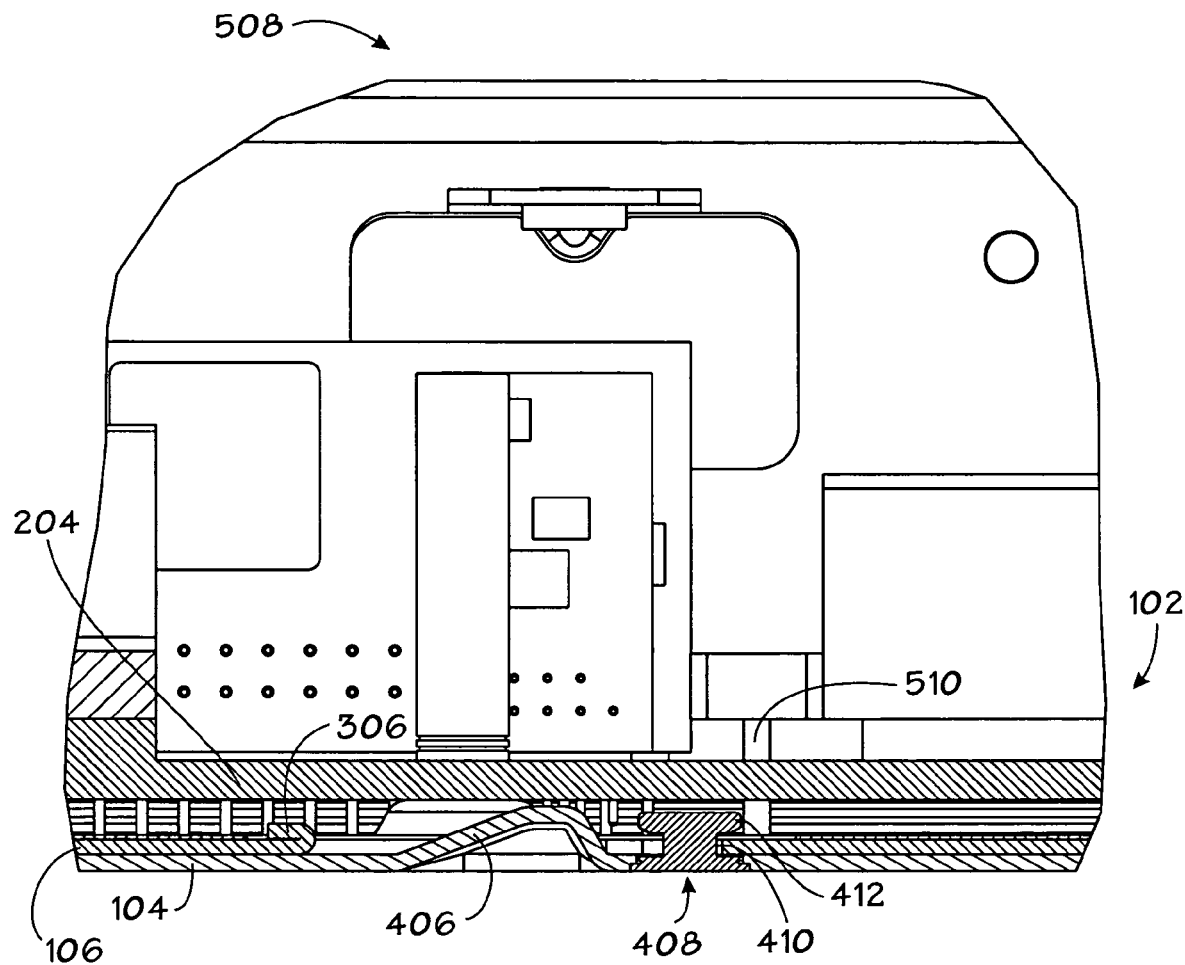

FIG. 5 is a perspective view of the blade server chassis 104 in accordance with an exemplary embodiment of the present invention. The blade server chassis 104 may be configured to protect the blade system board 102 and facilitate insertion of the blade server 100 into a blade enclosure, cabinet, and/or rack. In the illustrated embodiment, the blade server chassis 104 includes a protective housing with a generally planar base pan 402 and side walls 404. The blade server chassis 104 includes a number of ramp and spool pairs 112 extending from the base pan 402 to facilitate coupling of the blade server chassis 104 to the backing plate 106. Each of these ramp and spool pairs 112 includes a guide ramp 406 and a spool 408 disposed adjacent one another.

The guide ramps 406 generally include an angled portion having an acute angle (e.g., 10, 20, 30, or 40 degrees) relative to the generally planar base pan 402. The portion of each guide ramp 406 that is furthest from the base pan 402 may be referred to as a peak of the guide ramp 406. In the illustrated embodiment, the spool 408 for each ramp and spool pair 112 is positioned between the guide ramp 406 and the side of the chassis 104 configured to receive the board assembly 108. The guide ramps 406 may be attached to the base pan 402 or actually formed from the base pan 110. In other words, the guide ramps 406 may be coupled to the base pan 402. Further, the guide ramps 406 may be configured to guide the board assembly 108 during installation and removal. For example, the guide ramps 406 may facilitate sliding the backing plate 106 over the spools 408 until the receptacles 204 are in place over the ramp and spool pairs 112.

The spools 408 include a shaft or a post 410 and a flange or a head 412 coupled to the end of the shaft 410 opposite the base pan 402. In other words, the spools 408 have a relatively smaller diameter in the middle as compared to the outer end, which has a larger diameter or enlarged head. The spools 408 may be configured to engage the edges of the receptacles 204. For example, when the backing plate 106 and the chassis 104 are in a coupled configuration, the shafts 410 may extend slightly above the edges of the corresponding receptacles 204 and the flanges 412 may extend over a portion of the tapered edges 304 of the receptacles 204, thus holding the backing plate 106 and the chassis 104 in place.

The chassis 104 may also include a number of threaded standoffs 414 configured to receive the fasteners 202 (e.g., thumb screws) on the system board 102. In some embodiments, the threaded standoffs 414 may be positioned adjacent one of the guide ramps 406 instead of a spool 408. The standoffs 414 may receive the fasteners 202 once the board assembly 108 is in a coupled configuration with the chassis 104 to provide additional retention. The number of standoffs 414 and fasteners 202 may be increased or decreased based on the size of the system board 102 being mounted.

Installation of the board assembly 108 and the chassis 104 may be achieved by loading the assembly 108 from a first side of the chassis 104 and sliding it toward a second side of the chassis 104 that is opposite the first side. This motion is illustrated in FIG. 2 by the arrow 110. During installation, the board assembly 108 rides across the tops of the guide ramps 406 that are coupled to the chassis 104. The lead-in ramp 308 on the front of the backing plate 106 allows the board assembly 108 to slide smoothly across the ramp and spool pairs 112. Further, the receptacles 204 avoid prematurely engaging the ramp and spool pairs 112 because, as discussed above, they are unaligned. Once the receptacles 204 reach the corresponding ramp and spool pairs 112, the board assembly 108 drops down into the chassis 104 and the spools 408 engage the tapered edges 304 of the receptacles 204. This engagement between the spools 408 and the receptacles 204 resists vertical movement between the board assembly 108 and the chassis 104.

FIGS. 6A, 6B, 6C, and 6D are a series of four cross-sectional views of the board assembly 108 being slideably mounted to the chassis 104 in accordance with an exemplary embodiment of the present invention. Specifically, the four cross-sectional views in FIGS. 6A, 6B, 6C, and 6D illustrate the backing plate 106 in different positions as it is being guided over the chassis 104 into an engaged configuration, wherein the receptacles 204 are engaged with the ramp and spool pairs 112. The different positions represented in FIGS. 6A, 6B, 6C, and 6D may each be referred to as respective phases. Specifically, the position illustrated in FIG. 6A may be referred to as a first phase 502, the position illustrated in FIG. 6B may be referred to as a second phase 504, the position illustrated in FIG. 6C may be referred to as a third phase 506, and the position illustrated in FIG. 6D may be referred to as a fourth phase 508. Each of the four phases 502, 504, 506, and 508 is representative of a different position of one of the receptacles 204 in the backing plate 106 with respect one of the spool and ramp pairs 112 extending from the chassis 104.

The first phase 502 represents the position of the board assembly 108 and the chassis 104 in an uncoupled orientation, wherein the board assembly 108 is initially sliding into the chassis 104. In the first phase 502, the backing plate 106 is sliding over the guide ramp 406. In the second phase 504, the receptacle 204 is partially aligned with the ramp and spool pair 112 and the rolled edge 306 of the receptacle 204 is positioned proximate the peak of the guide ramp 406. In the third phase 506, the rolled edge 306 is being guided down a slope of the guide ramp 406 and the receptacle 204 is lowering over the ramp and spool pair 112. Finally, in the fourth phase 508, the chassis 104 and the board assembly 108 are in a coupled configuration. The backing plate 106 is lowered onto the base pan 402 of the chassis 104 and the ramp and spool pair 112 is engaging the edges of the receptacle 204. Specifically, the guide ramp 406 is disposed within the receptacle 204 and the spool 408 is engaging the tapered edge 304 of the receptacle 204. Further, the shaft 410 of the spool 408 is extending slightly above the tapered edge 304 and the flange 412 is positioned at least partially above the tapered edge 304 to resist vertical movement between the chassis 104 and the board assembly 108. It should be noted that, in the fourth phase 508, the flange 412 may abut a spacer 510 that resists further insertion of the board assembly 108 into the chassis 104 and cooperates with other spacers 510 to provide a substantially uniform gap between the backing plate 106 and the system board 102.

What is claimed is:

1. A mounting system comprising:
   a chassis comprising a base;
   a plurality of guide ramps and a plurality of mounting spools arranged in pairs extending from a first side of the base, wherein the pairs are unaligned with respect to one another relative to a direction along at least one length of the base;
   a backing plate coupled to the chassis via engagement of the pairs with a plurality of receptacles in the backing plate; and
   wherein the direction is an insertion direction of an electronic device into the chassis.

2. The mounting system of claim 1, wherein each of the plurality of guide ramps is disposed adjacent the corresponding mounting spool in the pair and each of the plurality of mounting spools is disposed between the corresponding guide ramp in the pair and an electronic board receiving side of the chassis.

3. The mounting system of claim 1, wherein each of the plurality of mounting spools comprises a support extending from the base and a flange disposed on an end of the support away from base.

4. The mounting system of claim 3, wherein each of the plurality of flanges partially extends over a tapered edge of a corresponding one of the plurality of receptacles.

5. The mounting system of claim 1, wherein each of the plurality of guide ramps includes a slope between a peak and the base.

6. The mounting system of claim 1, wherein the backing plate includes openings arranged to receive components extending from an electronic board.

7. The mounting system of claim 1, comprising an insulating sheet coupled to the backing plate.

8. The mounting system of claim 1, wherein said electronic device is coupled to the backing plate.

9. The mounting system of claim 8, wherein the electronic device comprises a system board, a disk drive, a hard drive, or a power supply.

10. The mounting system of claim 8, wherein the electronic device is coupled to the backing plate via screws disposed in recesses in the backing plate.

11. The mounting system of claim 1, wherein each of the plurality of receptacles comprises a ramped edge.

12. A mounting system comprising:
    a chassis comprising a base;
    a plurality of guide ramps and a plurality of mounting spools arranged in pairs extending from a first side of the base;
    a backing plate coupled to the chassis via engagement of each of the pairs within each of a plurality of receptacles in the backing plate; and
    wherein each of the plurality of receptacles has a width measured in a direction perpendicular to an insertion direction of said backing plate into the chassis; and
    wherein, said width of said receptacle varies in said insertion direction.

13. The mounting system of claim 12, wherein a first side of each of the plurality of guide ramps is disposed laterally adjacent a first edge of each of the plurality of receptacles, a shaft of each of the plurality of mounting spools is disposed laterally adjacent a second edge of each of the plurality of receptacles, and a flange of each of the plurality of mounting spools is disposed vertically adjacent the second edge of each of the plurality of receptacles.

14. The mounting system of claim 12, wherein each of the plurality of receptacles includes a shape that is partially tapered.

15. A chassis comprising:
    a base;
    a plurality of guide ramps and a plurality of mounting spools arranged in pairs extending from a first side of the base, wherein the pairs are unaligned with respect to one another relative to a direction along at least one length of the base, the pairs configured to couple with a plurality of receptacles in an electronic board assembly; and
    wherein the direction is an insertion direction of the electronic board assembly into the chassis.

16. The chassis of claim 15, wherein each of the plurality of guide ramps is disposed adjacent the corresponding mounting spool in the pair and each of the plurality of mounting spools is disposed between the corresponding guide ramp in the pair and an electronic board receiving side of the chassis.

17. The chassis of claim 15, wherein each of the plurality of mounting spools comprises a support extending from the planar base and a flange disposed on an end of the support away from the planar base and each of the plurality of guide ramps includes a slope between a peak and the base.

18. A method comprising:
    sliding an electronic device assembly in a first direction over a plurality of guide ramps and a plurality of mounting spools arranged in pairs extending from a first side of a base of a chassis, wherein the pairs are unaligned with respect to one another relative to the first direction; and
    coupling a back plate of the electronic device assembly with the pairs by sliding the electronic device assembly down a slope of the guide ramps in a second direction and respectively disposing each of a plurality of receptacles in the back plate about each of the pairs, the second direction being oriented generally toward the base.

19. The method of claim 18, comprising securing the electronic device assembly to the chassis via a hand screw that extends through the electronic device assembly into a threaded standoff of the chassis.

* * * * *

UNITED STATES PATENT AND TRADEMARK OFFICE
CERTIFICATE OF CORRECTION

PATENT NO. : 7,656,657 B2  Page 1 of 1
APPLICATION NO. : 11/656070
DATED : February 2, 2010
INVENTOR(S) : John R. Grady et al.

It is certified that error appears in the above-identified patent and that said Letters Patent is hereby corrected as shown below:

In column 7, line 31, in Claim 3, after "from" insert -- the --.

Signed and Sealed this

Eleventh Day of May, 2010

David J. Kappos
*Director of the United States Patent and Trademark Office*